United States Patent [19]
Morozumi

[11] Patent Number: 4,582,395
[45] Date of Patent: Apr. 15, 1986

[54] ACTIVE MATRIX ASSEMBLY FOR A LIQUID CRYSTAL DISPLAY DEVICE INCLUDING AN INSULATED-GATE-TRANSISTOR

[75] Inventor: Shinji Morozumi, Suwa, Japan

[73] Assignee: Kabushiki Kaisha Suwa Seikosha, Suwa, Japan

[21] Appl. No.: 288,605

[22] Filed: Jul. 30, 1981

[30] Foreign Application Priority Data

Jul. 31, 1980 [JP] Japan .................. 55-105307
Jul. 31, 1980 [JP] Japan .................. 55-105308
Oct. 2, 1981 [JP] Japan .................. 56-18228

[51] Int. Cl.⁴ .................. G09G 3/36; G02E 1/133; H01L 29/78
[52] U.S. Cl. .................. 350/334; 340/784; 350/333; 357/23.7
[58] Field of Search .................. 350/334, 333, 332; 340/784, 765; 357/23 TF, 7; 365/220, 240; 307/481, 482, 578, 279; 377/79

[56] References Cited

U.S. PATENT DOCUMENTS

| | | | |
|---|---|---|---|
| 2,567,970 | 9/1951 | Scaff | 357/7 X |
| 3,840,695 | 10/1974 | Fischer | 350/339 F |
| 3,851,313 | 11/1974 | Chang | 365/240 |
| 3,898,480 | 8/1975 | Spence et al. | 307/279 X |
| 3,922,703 | 11/1975 | Pankove | 357/23 TF X |
| 3,967,253 | 6/1976 | Tsuruishi | 357/42 X |
| 3,986,046 | 10/1976 | Wunner | 307/481 |
| 4,015,279 | 3/1977 | Ham | 357/23 TF |
| 4,024,626 | 5/1977 | Leupp et al. | 29/571 |
| 4,239,346 | 12/1980 | Lloyd | 350/333 X |
| 4,277,884 | 7/1981 | Hsu | 29/571 X |
| 4,313,809 | 2/1982 | Benyon et al. | 29/571 X |
| 4,327,477 | 3/1982 | Yargon et al. | 29/571 X |
| 4,349,395 | 9/1982 | Toyokura et al. | 29/571 X |
| 4,358,326 | 11/1982 | Doo | 29/571 X |
| 4,448,491 | 5/1984 | Okubo | 350/339 R X |

OTHER PUBLICATIONS

Hayama et al, "Amorphous-Silicon Thinfilm Metal-Oxide-Semiconductor Transistors", Appl. Phys. Lett., 36(9) (May 1, 1980) American Institute of Physics, pp. 754-755.
Fischer, "Flat TV Panels with Polycrystalline Layers", MacKintosh Pub. Ltd., Micrelectronics, vol. 7, No. 4, pp. 5-15, Jun. 1976.

Primary Examiner—John K. Corbin
Assistant Examiner—David Lewis
Attorney, Agent, or Firm—Blum Kaplan Friedman Silberman & Beran

[57] ABSTRACT

An active matrix assembly for a liquid crystal display device utilizing an MIS (metal-insulator-semiconductor) transistor array is provided. The active matrix assembly includes a transparent substrate, a first thin layer of silicon disposed thereon, an insulating film on the first silicon layer and a second thin layer of silicon disposed on the insulating film. The layers are selectively etched for forming a gate and the silicon layers are doped for forming a MOS transistor for a display element of the device. The two silicon layers and insulating material intersect to form capacitors with the upper electrode of the storage capacitor being the driving electrode for the liquid crystal. An active matrix assembly constructed and arranged in accordance with the invention permits 90 percent or more of incident light coming from above to pass therethrough. Use of such a transparent substrate in an active matrix liquid crystal display device permits utilization of a transparent liquid crystal drive, such as the field effect type liquid crystal for providing a maximum degree of contrast. Operation of the device with peripheral drive circuits for the gate lines and data lines including non-inverting rationless shift registers formed in the same manner as the active matrix permits a substantial reduction in power consumption due to reduced parasitic capacitance.

53 Claims, 23 Drawing Figures

FIG. 16
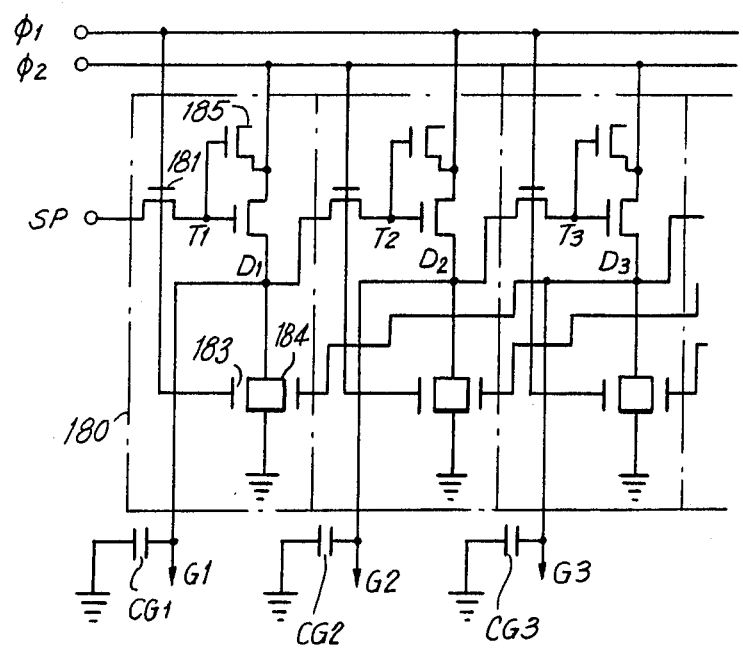
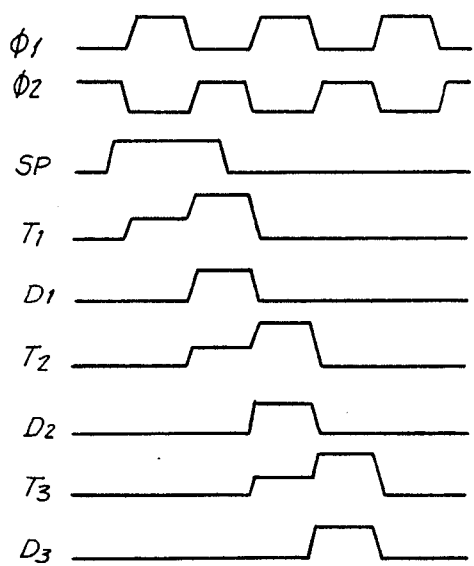
FIG. 17

ACTIVE MATRIX ASSEMBLY FOR A LIQUID CRYSTAL DISPLAY DEVICE INCLUDING AN INSULATED-GATE-TRANSISTOR

BACKGROUND OF THE INVENTION

This invention relates generally to an active matrix assembly for a liquid crystal display device, and more particularly to an active matrix assembly utilizing a MIS (metal-insulator-semiconductor) transistor array formed on a transparent substrate.

Liquid crystal display devices including active matrixes currently are attracting much attention as the size of the matrix can be increased. This permits enlargement of the display device including a greater number of individual display elements or dots. In view of this, application of the active matrix to a television display is now under serious consideration, since a passive display element for a liquid crystal display has an inherent limitation as to drive duty in the dynamic system.

The dynamic system in the conventional liquid crystal display has a limitation of a 1/16 drive duty. In view of this, it is difficult to display a matrix of dots arranged in 100 rows by 100 columns, or more. However, the active matrix system is known to overcome this drive duty limitation of the dynamic system. In the active matrix system, the switching element or transistor is disposed in a position corresponding to each dot of the display. Additionally, there are known display devices wherein a transistor and a driving electrode for the liquid crystal are formed on a single crystal silicon wafer, or a single crystal silicon film on an SOS substrate. In these latter cases, the liquid crystal material is enclosed between the wafer or the SOS substrate and the upper glass panel. Examples of devices constructed in this manner are shown in the papers in the 1977 Society of Information Display Digest at pages 64–65 and the 1976 SID Digest at pages 76–77. When a transistor is formed on a glass substrate, semiconductor compounds, such as Cd and Se have been utilized for forming the transistor.

The active matrix assembly based on a silicon wafer, or SOS substrate is an expensive raw material for use in a display device. Production and processing costs are expensive. Additionally, the wafer or substrate in these cases is opaque or only somewhat transparent, thereby reducing the display performance. Furthermore, when utilizing one of the semiconductor compounds, the material is poisonous which adds to the processing difficulties. There is also the disadvantage that the semiconductor characteristics are unstable and the reliability of such devices is low.

Accordingly, it is desirable to provide an active matrix assembly for a liquid crystal display device using an MIS (metal-insulator-semiconductor) transistor array on a substantially transparent substrate thereby permitting field effect drive for providing a maximum degree of contrast at low power consumption.

SUMMARY OF THE INVENTION

An active matrix assembly for a liquid crystal display device including an MIS (metal-insulator-semiconductor) transistor array is provided. The active matrix assembly includes a transparent substrate having stable silicon film selectively disposed thereon for forming the transistor, capacitor electrodes and drive electrode for the liquid crystal.

The active matrix assembly in accordance with the invention includes a first thin layer of silicon disposed on the transparent substrate, a gate insulator film and a capacitor dielectric film disposed on the first thin film, and a second thin film of silicon disposed on the insulator film. The second thin film of silicon defines a transistor channel or gate and forms a liquid crystal driving electrode as well as a capacitor electrode.

The active matrix assemblies in accordance with the invention are prepared by a low-temperature process at temperatures below about 600° C. or a high-temperature process including temperatures above 600° C. A first thin layer of silicon is deposited on a high-melting point glass or quartz substrate and ions are diffused therein to define the source, drain and channel of a transistor. Selective photo-etching defines a gate or channel and a capacitor electrode. An insulator film is formed on the surface to define a gate insulator film and dielectric for the capacitor. A second thin film of silicon is deposited and photo-etched with ions diffused except in the region for forming the transistor channel, thereby forming source and drain electrodes, a data line with the second silicon film being a transparent electrode for driving the liquid crystal. Laser annealing improves transistor performance in the low-temperature process. The assemblies thus formed transmit 90 percent of incident light permitting a transparent liquid crystal drive for display for displays of improved contrast.

Peripheral drive circuits formed on the substrate include non-inverting ratioless shift registers for driving the gate lines and data lines of the transistors of the active matrix array at low power consumption. These drive circuits may be formed at the same time as the display cells facilitates electrical connections leading to significant processing advantages and cost savings and parasitic capacitances are significantly reduced.

Accordingly, it is an object of the invention to provide an improved active matrix assembly.

It is another object of the invention to provide an improved active matrix assembly for a liquid crystal display device including an MIS (metal-insulator-semiconductor) transistor array.

It is a further object of the invention to provide an improved active matrix assembly utilizing a transparent substrate.

Still another object of the invention is to provide an improved active matrix assembly utilzing stable silicon film on a transparent substrate, such as glass or quartz.

Still another further object of the invention is to provide a improved method for forming an active matrix assembly including an MIS (metal-insulator-semiconductor) transistor array.

Yet another object of the invention is to provide improved peripherial drive circuits for the active matrix assembly.

It is another object of the invention to provide a method for forming the active matrix assembly and peripherial drive circuits simultaneously.

It is a further object of the invention to provide an active matrix assembly having peripherial drive circuits including an non-inverting ratioless shift registers.

Still other objects and advantages of the invention will in part be obvious and will in part be apparent from the specification.

The invention accordingly comprises the several steps and the relation of one or more of such steps with respect to each of the others, and the apparatus embodying features of construction, combination of elements and arrangement of parts which are adapted to effect such steps, all as exemplified in the following detailed disclosure, and the scope of the invention will be indicated in the claims.

BRIEF DESCRIPTION OF THE DRAWINGS

For a fuller understanding of the invention, reference is had to the following description taken in connection with the accompanying drawings, in which:

FIG. 16 is a circuit diagram of a peripheral drive circuit including a shift register cell for applying signals to the gate line of an active matrix assembly in accordance with the invention;

FIG. 17 are wave forms for the drive circuit of FIG. 16;

DESCRIPTION OF THE PREFERRED EMBODIMENTS

Figure 1:
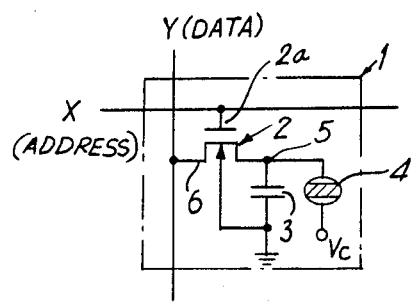
FIG. 1 is a circuit diagram of a display cell utilized in an active matrix assembly of a liquid crystal display device.

FIG. 1 of the accompanying drawings illustrates a circuit for one cell 1 including a liquid crystal display element 4 in a assembly in a matrix liquid crystal display device. Cell 1 includes an address line designated X connected to a transistor 2 at a gate 2a. A data line designated Y is connected to transistor 2 at a drain 6. A storage capacitor 3 is coupled to transistor 2 at a source 5 with one plate of capacitor 3 being an electrode for driving display element 4. When transistor 2 is turned on, a signal from data line Y is stored as an electric charge in storage capacitor 3. At the same time, the signal stored in capacitor 3 drives liquid crystal display element 4 until such time as another data signal is applied thereto. The second electrode of liquid crystal display element 4 is designated VC which is a common electrode signal in the display matrix. Display element 4 undergoes little leakage, and accordingly, the charge may be stored for a short period of time. Transistor 2 and capacitor 3 are formed in the same manner as forming conventional integrated circuits.

Figure 2:
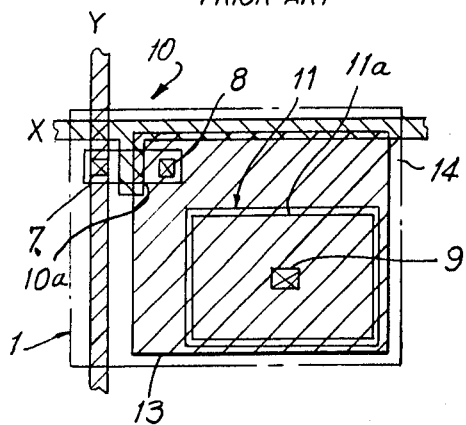
FIG. 2 is a plan view of the display cell formed in bulk silicon and driven by a circuit of the type illustrated in FIG. 1.

FIG. 2 illustrates in plan view an arrangement wherein the circuit for the liquid crystal display cell 1 of FIG. 1 is assembled by the silicon gate process. In this case, a transistor 10 and a capacitor 11 are formed on a single silicon wafer substrate 14. An address line X and a lower electrode 11a of capacitor 11 are formed of a polycrystalline silicon (polysilicon). A data line Y and an upper capacitor electrode 13 which also serves as a liquid crystal driving electrode are made of reflective aluminum. Substrate 14 and the aluminum layer (data line Y and upper driving electrode 13) and the polysilicon layer (gate 10a of transistor 10 and lower electrode 11a of capacitor 11) are electrically connected through contact holes 7, 8 and 9 formed in the region of terminals of transistor 10 and reflective capacitor electrode 13. The array operates in the dynamic scattering mode.

A matrix assembly formed in this manner by the ordinary IC processing is not entirely satisfactory for several reasons. First, since the matrix assembly is manufactured in the same process as integrated circuits, the manufacturing process is complicated and costly. Additionally, the yield is poor due to inherent junction leakage between the silicon substrate and the other components. This results in increased overall costs for manufacture. Particularly, a leakage current flows across the junction between the silicon substrate and a diffusion layer which acts as a source and drain. The leakage current is substantially dependent upon defects in the single crystal. Such leakage current is about several hundred PA or less for an ordinary cell. With this arrangement, it is difficult to eliminate the leakage current in all of several tens of thousands of cells. The junction leakage causes the charge stored in capacitor 11 to discharge, thereby lowering the degree of contrast of the display.

A second disadvantage is that since liquid crystal driving electrode 13 is of reflective aluminum and does not transmit light, a light-transmissive arrangement such as an FE liquid crystal as is conventional in many liquid crystal display devices is not feasible. Hence, application of this type of assembly is limited to an arrangement in which light is reflected from the surface of aluminum electrode 13, such as, a guest-host liquid crystal or a DSM liquid crystal. The guest-host liquid crystal has a reduced degree of contrast, and the DSM liquid crystal is greatly dependent on the angle of vision so as to be effectively usable.

A third disadvantage resides in the fact that light which enters the silicon substrate through a gap at aluminum electrode 13 forms electron-hole pairs which are diffused to produce a photo-current. This discharges capacitor 11 with resulting lowered display contrast. In view of these disadvantages, the present invention seeks to provide an arrangement which will eliminate the foregoing problems, and which comprises a thin-film transistor with a channel formed by a thin film silicon layer on a wafer of glass, quartz or silicon.

Figure 3A:
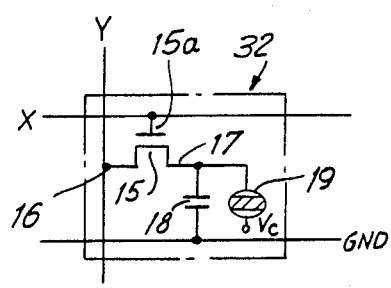
FIG. 3(a) is a circuit diagram of a display cell in an active matrix assembly of a liquid crystal display device constructed and arranged in accordance with the invention.

FIG. 3(a) is a circuit diagram of a liquid crystal display cell 21 including a display element 19 in a matrix assembly arranged in accordance with the invention. The circuit for matrix cell 21 of FIG. 3(a) is basically the same as the structure illustrated in FIG. 1, except that a ground line GND is added for a storage capacitor 18. Accordingly, the circuit includes an address line X and a data line Y coupled to a transistor 15 at a gate 15a and a source 16, respectively. Capacitor 18 is coupled to a transistor drain 17 and holds the charge for display element 19. The ground lines of FIG. 1 are dispensed with as described below. Liquid crystal display element 19 is the matrix element which writes and holds data essentially in the same manner as the conventional driving circuit of FIG. 1. The ground (GND) is held at a constant bias voltage with a bias level or a signal level selected as desired.

Figure 3B:
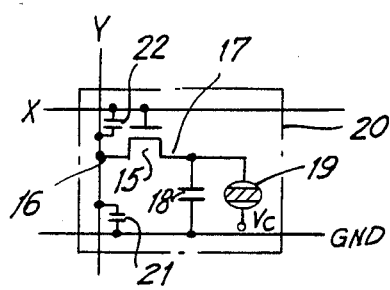
FIG. 3(b) is another circiut diagram of a display cell in an active matrix assembly of a liquid crystal display device constructed and arranged in accordance with a further embodiment of the invention.

In FIG. 3(b), an additional circuit for driving display element 19 in accordance with a further embodiment of the invention is shown. The circuit of FIG. 3(b) is similar to the circuit of FIG. 3(a) except that a capacitor 21 is shown between data line Y and ground line GND and a capacitor 22 is shown between data line Y and address line X. Either capacitor 21 or capacitor 22 serves to sample and hold a display data input.

Figure 4:
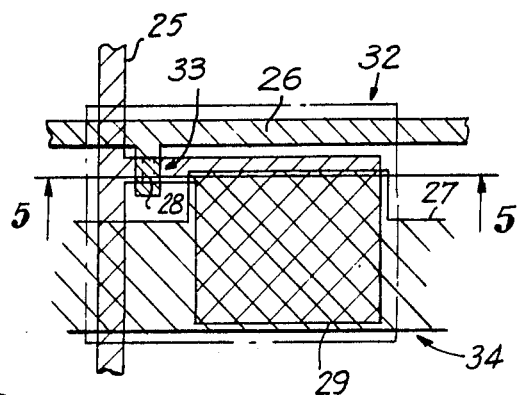
FIG. 4 is a plan view of a display cell of an active matrix assembly for a liquid crystal display device constructed and arranged in accordance with the invention as illustrated in FIG. 3(a)
Figure 5:
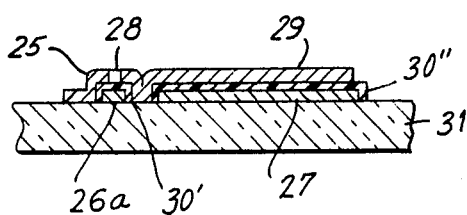
FIG. 5 is a cross-sectional view of the display cell of FIG. 4 taken along line 5—5 in FIG. 4.

Referring now to FIG. 4, a plan view of a liquid crystal display cell 32 of a matrix arrangement constructed and arranged in accordance with the invention is shown. FIG. 5 illustrates a cross-sectional view taken along line 5—5 of FIG. 4. Display cell 32 is formed on a transparent substrate 31. In the plan view of FIG. 4, an address line 26 is shown connected to a gate 26a of a channel 28 of a transistor 33 having a source defined by a data line 25 and drain defined by an upper capacitor electrode 29 which also serves a liquid crystal driving electrode. A ground line 27 is formed in the same manner as address line 26 and forms a capacitor 34 between itself and electrode 29.

Referring specifically to FIG. 5, the cross-sectional view of display cell 32 of FIG. 4 will be described by way of the process of manufacturing the cell as an illustrative example. Substrate 31 is a high melting point glass, such as quartz. A first polysilicon layer of a thickness of about 3,000 Å is grown on substrate 31 and P ions are implanted over the entire surface to form an N-silicon layer. A first thin film of SiO$_2$ may be formed in advance, as desired for improved intimate bonding contact. Gate line 26 and capacitor electrode and ground line 27 are formed by photoetching. Insulation films 30 of SiO$_2$ of about 1,500 Å in thickness are grown through thermal oxidation for forming a gate insulator film 30' and a dielectric film 30'' of capacitor 34. A second layer of polysilicon is formed on films 30 and photo-etched to form a pattern thereon. With a photoresist mask placed over the second polysilicon layer, P ions are implanted over the region except for channel 28, thereby forming source and drain electrodes, a data line 25 and a driving electrode 29 for driving the liquid crystal material, the driving electrode doubling as the capacitor electrode. Generally, a transistor formed in this manner is not entirely satisfactory in performance with respect to threshold and conductance. Localized channel 28 or the overall assembly may be illuminated uniformly with laser light to fuse and solidify the polysilicon layers in a short period of time for grain growth. This improves the transistor performance. Such process is referred to as "laser annealing".

Figure 6:
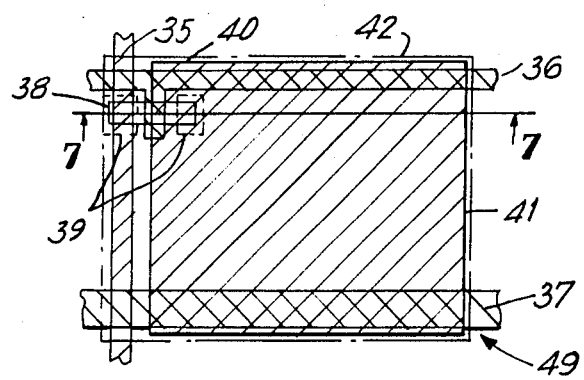
FIG. 6 is a plan view of a display cell of an active matrix assembly for a liquid crystal display device constructed and arranged in accordance with the further embodiment of the invention as illustrated in FIG. 3(b)
Figure 7:
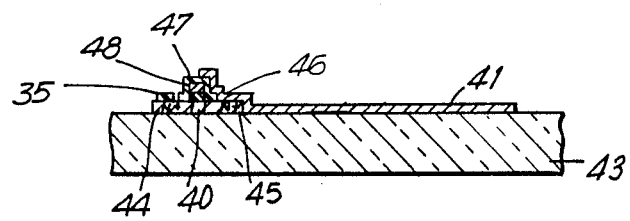
FIG. 7 is a cross-sectional view of the display cell of FIG. 6, taken along line 7—7 of FIG. 6.

Referring now to FIG. 6, a plan view of a liquid crystal display cell 49 of matrix arrangement constructed and arranged in accordance with another embodiment of the invention shown. FIG. 7 is a cross-sectional view taken along line 7—7 of FIG. 6. A first thin silicon film 38 which defines a source 44, a drain 45 and a channel 40 of a transistor is disposed on a transparent substrate 43. A second thin layer of silicon or its equivalent forms a gate line 36 serving as the gate of the transistor. A ground line 37 and a data line 35 are formed of a transparent low-resistance material, such as an indium and tin oxide film, a SnO$_2$ film, or a metal layer having a thickness of only several hundred Å or less. Contact holes 39 are formed for connecting a liquid crystal driving electrode 41 and the remaining layers together.

The region wherein ground line 37 and liquid crystal driving electrode 41 overlap defines charge-holding capacitor 18 in the circuit illustrated in FIG. 3(b). Source 44 and drain 45 of the transistor are formed by an N+ diffusion (P+ diffusion if a P type channel is to be formed). Channel 40 is formed below a gate electrode 48 with a gate insulation film 46 interposed therebetween. Gate electrode 48 is surrounded by an insulation film 47, such as an oxide film.

Figure 8A:
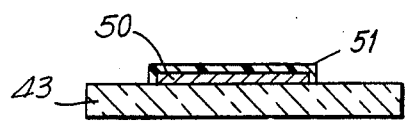
FIGS. 8(a), (b), and (c) are cross-sectional views illustrating steps of the method of forming the active matrix assembly in accordance with the invention.

FIG. 8 is illustrative of a process for manufacturing the active matrix display cell of the type illustrated in FIGS. 4–7. There are two principal manufacturing processes available, one being a low temperature and the other being a high-temperature process. The low-temperature process utilizes the transparent glass substrate, or a high melting point glass, such as Pyrex or Corning glass. The low-temperature process is performed at temperatures of 600° C., or below and utilzes a relatively inexpensive substrate. In accordance with this low-temperature process, a first thin film of silicon is formed on substrate 43 by a CVD process, such as plasma CVD, or reduced-pressure CVD, or sputtering. The thin film silicon thus formed is patterned as desired by conventional photo-etching techniques. The surface of the first thin film silicon is oxidized in an O$_2$ plasma atmosphere. In practice, an equivalent insulation film may be deposited by CVD. As a result of this, an oxide film 51 which will serve as the gate insulating film as formed on first thin film of silicon 50, as illustrated in FIG. 8(a).

Figure 8B:
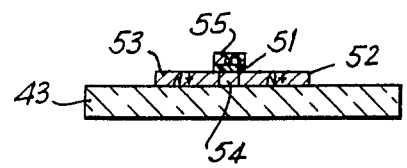
Figure 8C:
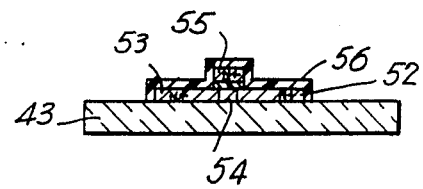

A second thin layer of silicon 55 is deposited in the same manner as the first thin layer of silicon and it is selectively patterned by photo-etching. Oxide film 51 is etched with second thin layer of silicon 55 acting as a mask to define gate insulation film 51. At the same time, a window opening is effected prepatory for diffusion and ions are implanted to make the diffusion whereupon a source 52 and a drain 53 are formed as illustrated in FIG. 8(b). At this time, the assembly is subjected to a further plasma treatment in a $O_2$ atmosphere to form a plasma oxide film 56 on the surface thereof. The assembly is then annealed at a temperature in the range of 100° C. to 600° C. as illustrated in FIG. 8(c). The foregoing process is characterized in that the thin film of silicon is oxidized directly by a plasma treatment. The gate insulation film of the transistor and the dielectric film of the capacitor produced by this process are more advantageous than oxides films produced by CVD in that the mobility of the transistor is improved and the reliability of the assembly is increased.

The high-temperature process is also based on using a transparent substrate, but utilizes a substrate having a melting point of 600° C. or higher as it includes a step to be performed at temperatures exceeding 600° C. Since this high-temperature process is capable of annealing at the high temperatures utilized, stability and reliability of the transistors formed thereby are improved. The high-temperature process will also be described with reference to FIG. 8 as the structure of the transistor formed is the same as that of a transistor produced by the low-temperature process described above.

In FIG. 8(a) a first thin layer of silicon is formed on transparent substrate 43 by reduced-pressure or normal pressure CVD and patterned to provide an island 40. Island 40 has been thermally oxidized at a temperature between 900° C. and 1,100° C. to form an oxide film 41 thereon. Subsequently, as illustrated in FIG. 8(b), a second thin layer of silicon is deposited on oxide film 51 in the same manner as the first thin layer of silicon. As gate electrode 55 is patterned which then used as a mask to etch insulating film 51. N+ or P+ impurities are pre-deposited, or ions are implanted without etching insulating film 51 to form source 52 and drain 53 of the transistor. Thereafter, a thermal oxide film 56 which will serve as the dielectric film of the charge-holding capacitor of the display element is formed in the same manner as the gate insulation film as illustrated in FIG. 8(c).

In the embodiment illustrated in FIG. 7, gate insulating film 46 of the transistor is self-aligned by forming the first thin layer of silicon on the thin oxide or silicon film. Such self-alignment reduces parasitic capacitance and thereby prevents reduction of mobility and speed in comparison to single crystalline bulk silicon arrangement. In addition, the oxide film on the second thin layer of silicon or the insulation film on the first thin film is used as the dielectric film of the charge-holding capacitor 18 and capacitors 21 and 22 for sampling and holding the data line signal, as shown in FIG. 3(b). According to the conventional bulk silicon-type arrangements of the type illustrated in FIG. 2, the gate insulation film of the transistor and the charge-holding capacitor is only a thermal oxide film of bulk silicon. However, where doping of impurities results in gate-self alignment as shown for the embodiment of FIG. 8(b) in accordance with the invention, high density impurities cannot go under the second layer of silicon which will constitute one electrode of the capacitor. The capacitor thus formed in the bulk silicon construction is unstable and difficult to use. For the capacitor to be used, an additional step is necessary to dope the lower capacitor electrode heavily with impurities as with the bulk silicon. As shown in the embodiment in FIG. 6, the dielectric film which will form the charge-holding capacitor is formed on the second thin layer of silicon thereby simplifying the process and rendering a stabilized capacitor.

Steps subsequent to the step of FIG. 8(c) are substantially the same in both the low-temperature or the high-temperature processes. Contact holes are formed to provide contact between the line, the first and second layers of silicon, and a material which serves as the line transparent drive electrode. A NESA film, a metal film having a thickness of only several Å or thinner, and the like are disposed on the assembly by sputtering or evaporation and selectively patterned by photo-etching. Where a material such as a NESA film is employed which is difficult to obtain direct contact with a thin film of silicon, a substance such as Au, Ni-Cr, or the like is applied to the region of contact for ease of contact. Since the transistors prepared in accordance with the process of the invention have reduced mobility and increased OFF leakage as compared to a transistor formed on both silicon, care should be taken during preparation to avoid difficulty in use.

Figure 9:
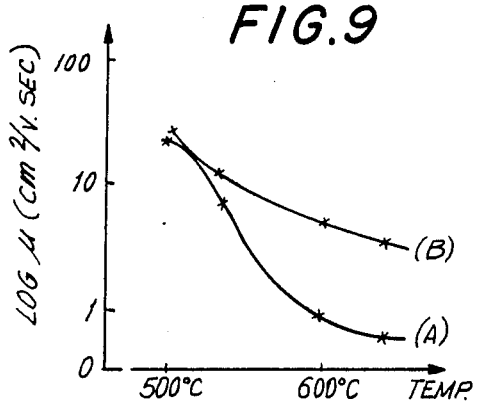
FIG. 9 is a graph illustrating the mobility of a transistor at 10 volts formed by the high-temperature process in accordance with the invention.
Figure 10:
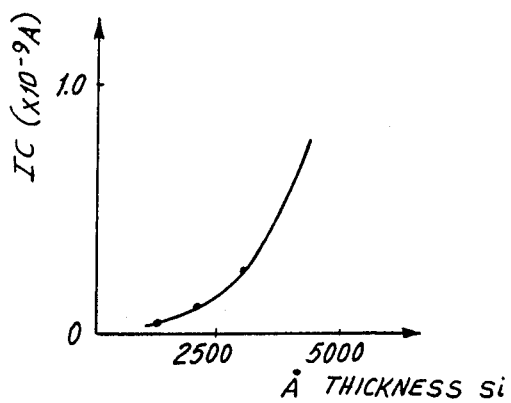
FIG. 10 is a graph illustrating the OFF leakage current IL of a transistor at 10 volts as a function of the thickness of the first thin layer of silicon, the transistor formed in accordance with the invention.

Curve (A) in the graph of FIG. 9 represents the mobility of a transistor at 10 V which has formed by the high-temperature process. In this process, the first thin layer silicon is deposited by a reduced-pressure CVD device over varying temperatures. It has been found experimentally that mobility abruptly improves when the deposition temperature drops below 600° C. Accordingly, the improved mobility and reliability of response of the transistor can be obtained by forming the first thin layer of silicon by a reduced pressure CVD device at a temperature of 600° C. or less. The graph in FIG. 10 illustrates OFF leakage current IC for a transistor at 10 V as a function of the thickness of the first thin layer of silicon. It has been found through experiments that the leakage current is reduced below about 500 PA or less. This enables trouble-free usage of the transistor when the thickness of the first silicon layer is about 3,700 Å, or less.

The low-temperature process as well as the high-temperature process for forming the active matrix assembly causes a substantial reduction in mobility of the transistor. It is therefore significant that improvements may be obtained by annealing the first thin layer of silicon with a laser or electron beam. Such annealing is applied locally at a high temperature with care taken not to affect adversely the substrate. Curve (B) in FIG. 9 demonstrates increased and improved mobility of a transistor having a thin silicon film prepared in the same manner as that for curve (A) and subsequently illuminated with a laser beam of 0.12 mJ per pulse in a pulse width of S on sec by a Q switch method. Furthermore, the mobility of a transistor prepared in accordance with the low-temperature process which has been formed by deposition of high-melting point glass at a temperature between about 500° C. to 540° C. and then laser-annealed under the same condition. This produces a transistor having the characteristics as indicated by curve (B) of FIG. 9. Based on the foregoing, it can be seen that localized annealing by the laser or electron beam is effective in both the low-temperature and high-temperature processes.

Figure 11:
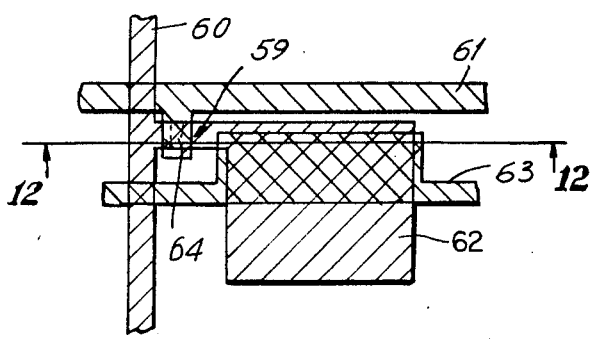
FIG. 11 is a plan view of a display cell of an active matrix assembly for a liquid crystal display device constructed and arranged in accordance with the further embodiment of the invention.
Figure 12:
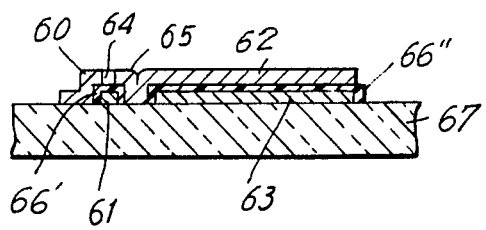
FIG. 12 is a cross-sectional view of the display cell of FIG. 11 taken through line 12—12 of FIG. 11.

FIG. 11 is a plan view of a liquid crystal display element of a matrix arrangement constructed and arranged in accordance with another embodiment of the invention. FIG. 12 is a cross-sectional view taken along line 12—12 of FIG. 11. An address line 61 is connected to a gate 59a of a channel 64 of a transistor 59 having a source defined by a data line 61 and a drain defined by a liquid driving electrode and capacitor electrode 62. A ground line 63 is formed at the same time as address line 60 and provides a capacitance and forms a storage capacitor 68 between itself and driving and capacitor electrode 62.

Referring specifically to the cross-sectional view in FIG. 12, the process of forming the display element will be described in connection with the high-temperature process. A thin film of polysilicon having a thickness of about 3,000 Å is grown on a transparent substrate 67 which is a glass of a high melting point, such as quartz. A thin film of $SiO_2$ may be formed in advance for improving intimate bonding contact. A $SiO_2$ film 65 having a thickness of about 1,500 Å is ground by thermal oxidization as a gate insulation film 66' and a dielectric film 66" of storage capacitor 68. A gate 61 and capacitor and liquid crystal driving electrode 63 are formed by photo-etching. Subsequently, a second film of polysilicon is formed and selectively patterned by photo-etching. With a photo-resist mask placed thereover, P ions are implanted over the areas except for channel 64, thereby forming the source and drain electrodes, data line 60, and drive electrode 62 for the liquid crystal which doubles as the upper capacitor electrode of capacitor 68 as noted above. When formed in this manner, performance of transistor 59 with respect to the threshold voltage and conductance is not entirely sufficient. For this reason, channel 64 or the entire surface area of substrate 67 is illuminated uniformly with a laser beam to fuse solidify the polysilicon over a short period of time for grain growth. This laser annealing, as noted above, improved performance of the display element.

Figure 13:
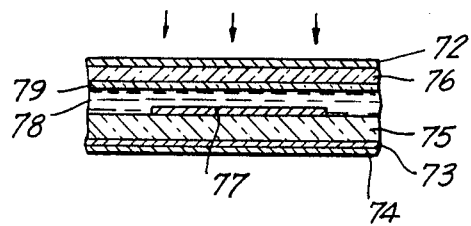
FIG. 13 is a cross-sectional view of a portion of a liquid crystal display device including an active matrix assembly constructed and arranged in accordance with the invention.

Referring now to FIG. 13, a schematic cross-sectional view of a liquid crystal display device which incorporates a matrix assembly constructed and arranged in accordance with the invention is shown. A liquid crystal material 78 is sandwiched between a quartz substrate 75 having a polysilicon electrode 77 thereon which represents the upper electrode of the storage capacitor in an assembly in accordance with the invention and an upper glass layer 76 with a common electrode 79 of a NESA layer disposed thereon. The device is disposed between an upper polarizing plate 72 and a lower polarizing plate 73 with a reflective plate 74 mounted to lower polarizer plate 73. Incident light from above the device passes substantially through polysilicon electrode 77 and is reflected by reflected plate 74 before the light is sensed by a viewer. Such a construction permits use of ordinary FE liquid crystals to be employed which provides the display with a high degree of contrast and a wide angle of vision.

Figure 14:
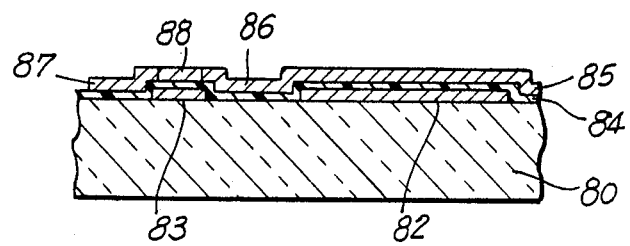
FIG. 14 is a cross-sectional view of a display cell of an assembly in accordance with the invention.

FIG. 14 is a cross-sectional view of yet another embodiment in accordance with the invention wherein the display cells are constructed on an ordinary glass substrate 80. A silicon film is formed on glass substrate 80 by a low-temperature film growing process such as sputtering or plasma CVD. P ions or B ions are then implanted all over the silicon film. A gate 83 and a capacitor electrode 82 are formed selectively by photo-etching. An insulator film 84, such as $SiO_2$ and the like, is then also formed by a low-temperature film growing process. A second silicon layer is also formed at a low temperature for forming a transistor source 87 and a transistor drain 86 and a capacitor and liquid crystal driving electrode 85. The second silicon layer is not doped, or B ions are implanted in the silicon layer to the extent sufficient for threshold enhancement. P ions are implanted in source 87 and drain 86 and the region that the define capacitor and driving electrode 85, except for a channel 88. Thereafter, a localized portion or the overall assembly is illuminated with a laser beam for annealing. The laser beam is absorbed partially in the first and second layers of polysilicon and passes through to glass substrate 80 annealing without adversely effecting glass substrate 80. This is possible when treating with an appropriate laser beam energy applied over a suitable interval of time (which is determined by a pulse interval with a pulse laser and by a scanning speed with a CW laser) for activation of non-implanted impurities in the first layer of polysilicon and for grain growth (particularly in channel 88) and activation of non-implanted impurities in the second layer of polysilicon. Such an arrangement is characterized in that less costly glass can be used as the substrate, since glass substrate 80 is much less adversely effected by laser annealing then by ordinary annealing. Significantly, the laser annealing activates the impurities and permits grain growth of the polysilicon for improving transistor characteristics, in particular the mobility.

Figure 15:
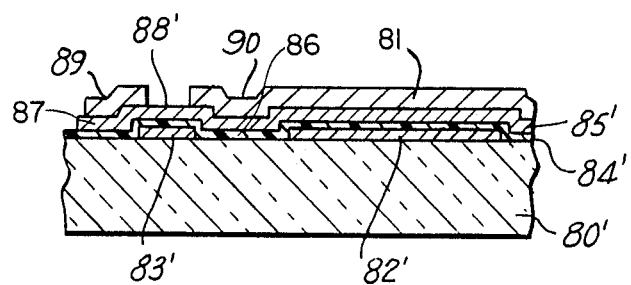
FIG. 15 is a cross-sectional view of a display cell of an assembly in accordance with yet another embodiment of the invention.

Referring to FIG. 15, a cross-sectional view of a further embodiment in accordance with the invention wherein a cell is constructed on an ordinary glass substrate 80' is shown. Like elements to the element of the embodiment illustrated in FIG. 14 are designated by the same reference numerals "primed". In addition to the process steps followed for forming the cell of FIG. 14, an aluminum film 81 is deposited on upper silicon layer 85' and patterned by photo-etching to form source and drain electrodes 89 and 90, respectively. The aluminum and silicon layers are subjected to heat treatment or illuminated with a weak laser beam to obtain good contact between the layers.

The display cell of the embodiment illustrated in FIGS. 11 and 12 can, of course, be constructed by a low temperature process. The structure of this display cell is characterized in that the transistor gate is defined by the first layer of silicon and the transistor channel is defined by the second layer of silicon as in the embodiments illustrated in FIGS. 4 and 5. Heavy diffusion is possible for both of the thin films of silicon, as desired and the gate oxide film which is formed by oxidizing the first layer of silicon or the gate insulation on the first layer of silicon is available as a dielectric layer which defines and charge-holding capacitor. Therefore, only a single step of forming the oxide film is necessary. Another advantage accruing from the construction in accordance with the invention as illustrated in these figures is that the first layer of silicon provides address and ground lines and the second layer of silicon provides data lines. In view of this, it is not necessary to deposit a wiring material and to shape it by photoetching which is necessary in the construction illustrated in FIGS. 6 and 7. Significantly, a silicon film is used as a transparent electrode for driving the liquid crystal material, the silicon film being sufficiently transparent if it is about 3,000 Å in thickness or less.

The embodiments of the invention illustrated in the construction of FIGS. 6 and 7, FIGS. 11 and 12, and FIG. 15 employ a transparent liquid crystal driving electrode on the respective transparent substrate. Thus, each construction can provide a display device having a much greater degree of contrast than that obtained by use of bulk silicon-type substrate. This is the case because the bulk silicon type substrate is substantially opaque and cannot use a FE(TN) liquid crystal which provides maximum contrast in a display device.

When an opaque substrate or an opaque driving electrode is utilized in an assembly constructed and arranged in accordance with the present invention, substantial improvement in contrast is not obtained if a guest-host type or a DSN-liquid crystal is utilized when compared with conventional bulk silicon. However, the constructions in accordance with the invention do serve to simplify the manufacturing steps of the matrix assembly. Thus, this increase in production yield for each step will prevent elimination of the displayed images due to current leakage caused by incident light.

When the substrate of a device prepared in accordance with the invention is glass, quartz, or the like, a display panel can be assembled more easily than a conventional panel wherein one of the electrodes for driving the liquid crystal is formed of bulk silicon. Conventional constructions included a silicon wafer as an assembly substrate in place of transparent substrate 75 as illustrated in FIG. 13. Since the silicon wafer is of a single crystal, it tends to crack easily along a cleavage plane when subject to forces applied during assembly. In addition, a silicon wafer frequently warps when thermally treated for 10 m or more while liquid crystal material 78 has a thickness of from about 5 to 15 $\mu$m. With liquid crystal materials having a constant thickness, the assembly operation becomes complicated.

The liquid crystal material in liquid crystal display devices are often insufficiently sealed at elevated temperatures because the liquid crystal material and the plates forming the cell have different coefficients of expansion. This difficulty is overcome by a construction in accordance with the present invention wherein glass or a similar material is used as the substrate for the lower electrode. Thus, the display panel can be easily assembled providing excellent yields in the same manner as conventional liquid crystal display panels.

The data-holding capacitor in the circuit for the display element in accordance with the present invention serves to hold display data for the cell during a certain period of time. For example, this may be about 16 msec. for a television picture image. Where a thin-film silicon transistor has a leakage current of about 100 PA or less at 10 V, data-holding capacitor should have a capacitance of from about 0.5 PF to 1 PF. When the thickness of the liquid crystal layer is 10 $\mu$m or less or if it has a high specific inductive capacity of 10 or greater, the liquid crystal layer itself should have a capacitance of 0.5 PF or above, with the result that no charge-holding capacitor is needed. The ground line and capacitor 18 in the circuits of FIGS. 3(a) and (b) can be omitted with the result that the effective liquid crystal display area is increased for improved contrast and excess elements are removed for increased production yield. The sampling and holding capacitance of data line Y is largely caused by parasitic capacitor 22 at a crossing between the data and address lines. Transistors formed in accordance with the present invention permit external drive circuits for the active matrix, namely a shift register and a sampling and holding circuit to be formed on the same substrate.

Referring specifically to FIG. 16, such a drive circuit for a gate line of a transistor in an active matrix assembly constructed and arranged in accordance with the invention is shown. The drive circuit includes a shift register cell 180 including four transistors 181, 182, 183 and 184 and a single bootstrap capacitor 185. A potential "1" applied to a start pulse input SP is transferred successively in synchronization with two-phase clock signals $\phi_1$ and $\phi_2$. Outputs $D_1, D_2, D_3 \ldots D_n$ of the shift register cells are applied to the gate lines for successive selection of the gate lines as illustrated by the waveforms of FIG. 17. An input transfer gate transistor 181 is connected to the input of each of the shift register cells. The potential "1" is stored initially at junctions $T_1, T_2, T_3 \ldots T_n$ and written in outputs $D_1, D_2, D_3 \ldots D_n$ by way of the bootstrap capacitors. If it were not for the presence of tranfer gate transistors 181, $D_1$ and $T_2$, $D_2$ and $T_3, \ldots D_{n-1}$ and $T_n$, would be short-circuited, which would require the bootstrap capacitance to be much greater than the gate line capacitance $CG_i$. This would enlarge the pattern and a reduced yield would result. For $D_1 \ldots D_n$ to be discharged to level "0", it is necessary only to connect $T_3$ to transistor 184. When shift register 180 is actuated at low frequency, it can malfunction if a slight leakage occurs. Thus, a potential-fixing transistor 183 is added to restore the clock signals to the level "0" for each half period thereof so as to increase yield and stabilize operation of the drive circuit.

Figure 18:
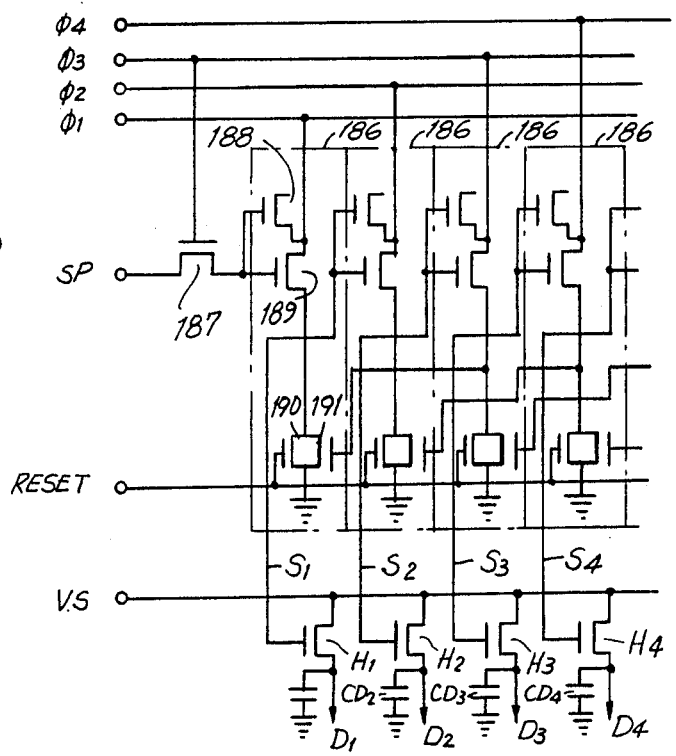
FIG. 18 is a circuit diagram of a peripheral drive circuit including a shift register and sample and hold transistors for applying video signals to the data lines in an active matrix assembly in accordance with the invention.

Referring to FIG. 18, a drive circuit for a data line of a transistor of an active matrix assembly constructed and arranged in accordance with the present invention is shown. The drive circuit of FIG. 18 includes a shift register cell 186 which includes a bootstrap capacitor 188, transistors 189 and 191 required for operation of the display element and a reset transistor 190 for selecting a shift register in the manner described below. A start pulse SP is applied to the drive circuit for the data line via input gate 187 to an initial shift register cell. Outputs $S_1, S_2, S_3 \ldots S_m$ from the shift register cells are applied to sampling and holding transistors $H_1, H_2, H_3 \ldots H_m$.

The video input V·S, a video signal or data writing signal which is synchronized with a scanning signal is caused to be sampled and held in each of the parasitic capacitors $CD_1, CD_2, CD_3 \ldots CD_m$ on the data line. Since the drive circuit for the data line as illustrated in FIG. 18 performs all operations in one scanning line, it operates at a high speed with substantially no concern over leakage current. However, care should be exercised to maintain high-speed operation and minimize power consumption which tends to increase due to high-speed operation.

Figure 19:
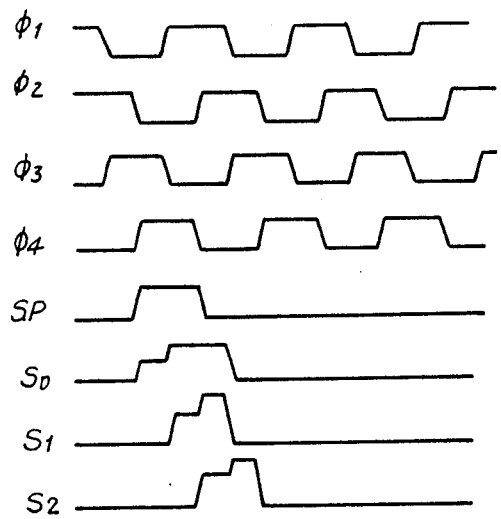
FIG. 19 are wave forms for the circuit of FIG. 18.

The shift register has a level of "1" only at one out of m bits, and hence power consumption is small unless it is clocked. The sampling and holding transistors $H_1, H_2, H_3 \ldots H_m$ are required to permit high-speed switching. Such a requirement can be met as the transistor gates are supplied with inputs which have an amplitude of two times greater than that of the clock signals due to bootstrap operation as indicated in the waveforms of FIG. 19.

Figure 20:
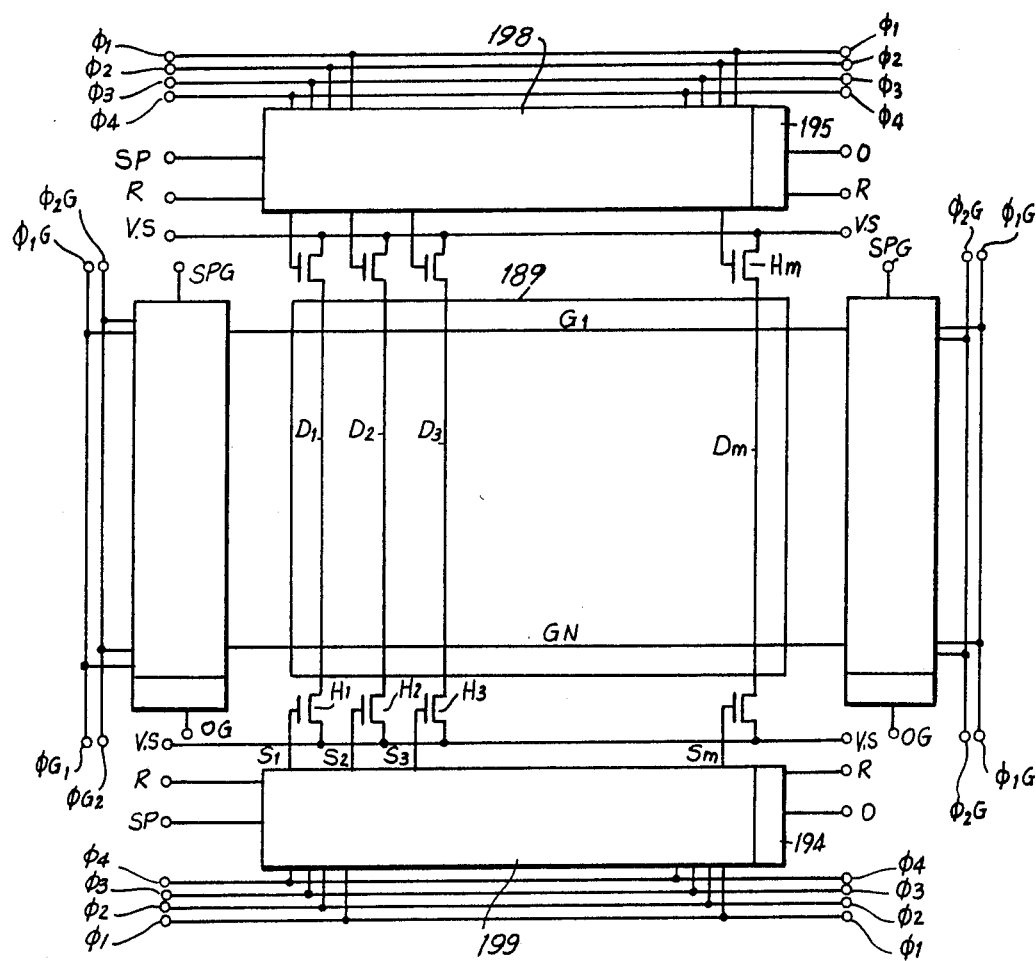
FIG. 20 is a circuit diagram of the peripheral drive circuits for use with an active matrix assembly constructed and arranged in accordance with an embodiment of the invention.

FIG. 20 is a circuit diagram showing how the drive circuit for the gate line of FIG. 16 and the drive circuit for the data line of FIG. 18 are combined into an active matrix assembly constructed and arranged in accordance with the invention. The peripheral drive circuit of FIG. 20 includes data shift registers 198 and 199, dummy cell 194 and 195 for producing return signals at the final stages, and sampling and holding transistors $H_1, H_2, H_3 \ldots H_m$, the arrangement of the circuit elements being symmetrical with respect to a horizontal center line. Gate shift registers 192 and 193 and dummies 196 and 197 are located symmetrically with respect to a vertical center line. The peripheral drive circuit need not be symmetrical and only one half would be provided under the circumstance in the illustrated embodiment; however, a plurality of rows, that is two rows of shift registers are provided for improved yield. It is contemplated within the invention that four or eight rows of shift registers may also be employed.

When the peripheral drive circuit for the active matrix assembly as illustrated in FIG. 20 includes transistors that are formed of thin films of silicon in accordance with the present invention, the following advantages result. Since the clock frequency is high on the data line side, namely several MHz, power consumption by the parasitic capacitors on a clock line is greater than by the shift registers. Specifically, with bulk silicon capacitance of the clock line and the capacitance at the junction to the substrate would amount to 100 PF or more resulting in a reduction in speed of clock pulses and a power consumption of 10 MA or above. However, the insulator substrate utilized in accordance with the present invention has a parasitic capacitance of only several PF which greatly cuts down power consumption and increases the speed of operation. Use of bulk silicon permits increased threshold voltage due to a back-gate effect if the potential at the source of transistor 182 of FIG. 16 are increased. As a result of this, it would be necessary to raise the voltage at gate $T_1$ of transistor 182 in order to obtain the required signal voltage. This would result in either an increase in the level of clock signal or bootstrap capacitor 185 would require a significantly larger area.

The construction in accordance with the present invention permits the transistor substrate to float without giving rise to a back-gate effect, and hence, the clock amplitude may be reduced with resulting lower power consumption. Additionally, the size of the bootstrap capacitor may be reduced thereby requiring a reduced surface area. Moreover, the bootstrap capacitors in the peripheral drive circuit of the present invention are formed essentially of isolation films between the gates and channels of the transistors, a feature which differs from the charge-holding capacitors. The bootstrap capacitor should have an inner-electrode capacitance which varies due to the voltage at the gate or upper electrode. To accomplish this, the lower electrode of the capacitor is formed of a film of silicon which is doped lightly, or not doped at all.

Simultaneous formation of the active matrix cells and the peripherial drive circuit with the thin film of silicon on the insulator substrate permits easy connective wiring and renders the entire assembly prepared in accordance with the invention less costly than conventional approaches. Since the peripheral drive circuits include non-inverting ratioless shift registers, as illustrated in FIGS. 16 and 18 with parasitic capacitance being reduced to a substantial degree, a reduction in the overall power consumption with an increase yield and a reduced cost are obtained.

As a result of this, the present invention provides an active matrix assembly having silicon transistors and silicon capacitors on a substrate which is more advantageous than conventional devices for the following reasons. The manufacturing process is simplifed and less costly. Prior bulk silicon processes required six separate photo-etching steps, whereas three of four photo-etching steps will suffice in accordance with the present invention. Additionally, an increased yield can be expected in accordance with the invention, since P-N junction areas are limited in number with only minimual junction leakage. As 90 percent or more of incident light coming from above the device passes therethrough and the interval of diffusion in the polysilicon is short, substantially no photo current is generated. Thus, the leakage current due to incident light is 10 PA or less even when the incident light is of 10,000 luxes. Thus, a displayed image is not eliminated under the influence of incident light.

Where the transparent substrate is utilized with a transparent liquid crystal drive, FE-type liquid crystal materials can be used for providing a display having a maximum degree of contrast. In this case, the display panel screen has an increased degree of lightness and the display is of improved quality. Where the substrate is made of glass or a similar material, the panel can be assembled with ease. This simplification of the assembly process compared with bulk silicon conventional devices results in increased assembly yields. When the peripheral drive circuits for the active matrix are formed as described, substantial reduction in power consumption results. Thus, the active matrix panel constructed and arranged in accordance with the present invention permits construction of a portable liquid crystal television display of low power consumption. Such a television screen can be formed which provides a high degree of contrast even when used outdoors under intensive sunlight conditions.

It will thus be seen that the objects set forth above, among those made apparent from the preceding description, are efficiently attained and, since certain changes may be made in carrying out the above processes and in the construction set forth without departing from the spirit and scope of the invention, it is intended that all matter contained in the above description and shown in the accompanying drawings shall be interpreted as illustrative and not in a limiting sense.

What is claimed is:

1. An active matrix assembly for a liquid crystal display device including a plurality of liquid crystal display elements and associated drive circuit components in the matrix arranged in columns and rows, comprising:
    a transparent substrate selected from the group consisting of glass, soda glass, high melting point glass and quartz;
    a first thin film of silicon selectively deposited on said substrate;
    an insulation film deposited on said first film of silicon; and
    a second thin film of silicon selectively deposited on said first insulation film;
    one of said first and second films of silicon defining one of a source, channel and drain region of a metal-oxide-semiconductor transistor and a gate of said transistor, said transistor coupled to an associated display element for driving said display element.

2. The active matrix assembly of claim 1, wherein said first silicon film defines the source, channel and drain regions of said transistor and the second silicon film defines the gate of the transistor.

3. The active matrix assembly of claim 2, wherein said first silicon film for defining the source, channel and drain regions of the transistor is formed as a non-doped layer.

4. The active matrix assembly of claim 3, wherein said source and drain regions of the transistor are formed by doping impurities into said first silicon film using the gate as a mask.

5. The active matrix assembly of claim 2, further including a second insulation film deposited on said second film of silicon and a wiring material selectively deposited on said second insulation film, said second insulation film defining a dielectric film in the region between said second film of silicon and said wiring material for defining a charge-holding capacitor for an associated display element.

6. The active matrix assembly of claim 1, wherein said first silicon film defines the gate of the transistor and the second silicon film defines the source, channel and drain regions of the transistor.

7. The active matrix assembly of claim 1, wherein said first insulation film defines a dielectric film and said first and second films of silicon define electrodes of a storage capacitor coupled to the junction between each said transistor and the associated display element.

8. The active matrix assembly of claim 1, wherein each said silicon film has a thickness of about 3,700 Å, or less.

9. The active matrix assembly of claim 1, further including a transparent liquid crystal driving electrode carried by said transparent substrate and coupled to an associated transistor.

10. The active matrix assembly of claim 9, including a wiring material for defining a data line deposited on said substrate, said transparent liquid crystal driving electrode and said wiring material both being formed of the same material.

11. The active matrix assembly of claim 10, wherein said transparent driving electrode is formed from a material selected from the group consisting of an indium and tin oxide transparent conductive film, a metal film having a thickness of about 500 Å or less, or a thin film of silicon.

12. The active matrix assembly of claims 1 or 9, further including a transparent plate for forming a liquid crystal display panel and a liquid crystal material driveable in the field effect mode disposed between said matrix assembly and said transparent plate.

13. The active matrix assembly of claims 1 or 9, further including peripheral drive circuits on said substrate including non-inverting ratioless shift registers for applying signals to said transistor.

14. The active matrix assembly of claim 1, wherein said matrix includes a plurality of spaced address lines defining a first axis of said matrix and a plurality of spaced data lines intersecting said address lines and defining a second axis of said matrix, said address and data lines being carried by said substrate, each of said transistors having its gate coupled to an address line and its source-drain path coupled to an intersecting data line.

15. The active matrix assembly of claim 14, including address shift register means having an input for receiving a start pulse and a plurality of outputs respectively coupled to said address line, said address shift register further including a plurality of shift register cells, each shift register cell including an input coupled to said address shift register input or to the output of the next proceeding cell, first and second clock inputs for receiving out of phase clock signals and an output for couplinhg to the next cell and to the associated address line, each said cell including transfer transistor means connected at its source-drain path between the cell input and a junction and its drain to one of said clock inputs, an operating transistor coupled at its gate to said junction and its source-drain path between the second clock input and the output, a bootstrap capacitor coupled between said junction and the second clock input, and means for discharging said bootstrap capacitor to terminate the output signal to the associated address line.

16. The active matrix assembly of claim 15, wherein said discharging means includes a discharging transistor having its source-drain path coupled between said output and ground and having its base coupled to said first clock input.

17. The active matrix assembly of claims 15 or 16, wherein said means includes a second discharging transistor having its source-drain path coupled between said output and ground and its gate coupled to the output of a later shift register cell in said address shift register.

18. The active matrix assembly of claim 15, wherein said address shift register is integrated on said substrate simultaneous with the formation of said first-mentioned transistors.

19. The active matrix assembly of claims 14 or 15, including a data shift register including start pulse input means, a data writing buss, a plurality of out of phase clock inputs and a plurality of data shift register cells associated respectively with each of the data lines, each said data shift register cell including an input, an operative transistor having its source-drain path coupled between one of said clock inputs and a junction and its gate coupled to the input, said input being coupled to either the start pulse input means or the junction of the prior data shift register cell, a bootstrap capacitor coupled between said input and the associated clock input, means for discharging said bootstrap capacitor when desired, and a sampling and hold transistor coupled at its gate to said junction and with its source-drain path between said data writing buss and the associated data line.

20. The active matrix assembly of claim 19, wherein said discharging means of said data shift register including a discharging transistor coupled with its source-drain path between the associated junction and ground and having its gate coupled to the junction of a later data shift register cell in said data shift register.

21. The active matrix assembly of claim 19, wherein said data shift register includes a reset input, each of said data shift register cells including a further short circuiting transistor coupled with its source-drain path between the associated junction and ground and with its gate connected to said reset input.

22. The active matrix assembly of claim 19, wherein said data shift register is integrated on said substrate simultaneous with the formation of first-mentioned transistors.

23. A liquid crystal display device including an active matrix assembly having a plurality of liquid crystal display elements and associated drive circuit components in matrix array, comprising:
   a transparent substrate;
   a first thin film of silicon deposited on said transparent substrate, said first film of silicon selectively formed to define one of a transistor gate and a transistor source, channel and gate coupled to each said display element;
   an insulation film deposited on said first film of silicon for defining the gate insulation film for said transistor;

a second film of silicon deposited on said first insulation film, said second silicon layer being selectively formed and doped to define the other of the transistor gate and the transistor source, channel and drain;

conductive means carried by said substrate and electically coupled to the source-drain path of each said transistor for defining the liquid crystal drive electrode for each said display element;

a first polarizer plate disposed adjacent to said transparent substrate;

a reflection plate disposed adjacent to said first polarizer plate;

a transparent plate having common transparent electrode means disposed on the interior surface thereof, said transparent plate placed opposite to and spaced apart from said matrix array for forming a space therebetween;

a second polarizer disposed on the exterior surface of said transparent plate; and a liquid crystal material in the space formed between said matrix array and the transparent plate.

24. The liquid crystal display of claim 23, wherein said liquid crystal material is a twisted nematic liquid crystal material adapted to be driven in the field effect mode.

25. The liquid crystal display device of claim 23, wherein said first and second films of silicon define the electrode of a storage capacitor associated with each display element, said first insulation film deposited therebetween defining a dielectric material for said storage capacitor, one of the electrodes of said storage capacitor being coupled to the junction between the source-drain path of the associated transistor and the liquid crystal drive electrode for the associated liquid crystal display element.

26. The liquid crystal display device of claim 25, and including a ground line formed of a conductive material carried by said substrate, said capacitor being coupled between said junction and said ground line.

27. The liquid crystal displays device of claim 23, wherein said matrix includes a plurality of spaced address lines defining a first axis of said matrix and a plurality of spaced data lines intersecting said address lines and defining a second axis of said matrix, said address and data lines being carried by said substrate, each of said transistors having its gate coupled to an address line and its source-drain path coupled to an intersecting data line.

28. The liquid crystal display device of claim 27, including address shift register means having an input for receiving a start pulse and a plurality of outputs respectively coupled to sadi address line, said address shift register further including a plurality of shift register cells, each shift register cell including an input coupled to said address shift register input or to the output of the next proceeding cell, first and second clock inputs for receiving out of phase clock signals and an output for coupling to the next cell and to the associated address line, each said cell including transfer transistor means connected at its source-drain path between the cell input and a junction and its drain to one of said clock inputs, an operating transistor coupled at its gate to said junction and its source-drain path between the second clock input and the output, a bootstrap capacitor coupled between said junction and the second clock input, and means for discharging said bootstrap capacitor to terminate the output signal to the associated address line.

29. The liquid crystal display of claim 28, wherein said discharging means includes a discharging transistor having its source-drain path coupled between said output and ground and having its base coupled to said first clock input.

30. The liquid crystal display device of claims 28 or 29, wherein said discharging means includes a second discharging transistor having its source-drain path coupled between said output and ground and its gate coupled to the output of a later shift register cell in said address shift register.

31. The liquid crystal display device of claims 27 or 28, including a data shift register including start pulse input means, a data writing buss, a plurality of out of phase clock inputs and a plurality of data shift register cells associated respectively with each of the data lines, each said data shift register cell including an input, an operative transistor having its source-drain path coupled between one of said clock inputs and a junction and its gate coupled to the input, said input being coupled to either the start pulse input means or the junction of the prior data shift register cell, a bootstrap capacitor coupled between said input and the associated clock input, means for discharging said bootstrap capacitor when desired, and a sampling and hold transistor coupled at its gate to said junction and with its source-drain path between said data writing bus and the associated data line.

32. The liquid crystal display device of claim 31, wherein said discharging means of said data shift register including a short circuiting transistor coupled with its source-drain path between the associated junction and ground and having its gate coupled to the junction of a later data shift register cell in said data shift register.

33. The liquid crystal display device of claim 31, wherein said data shift register includes a reset input, each of said data shift register cells including a further short circuiting transistor coupled with its source-drain path between the associated junction and ground and with its gate connected to said reset input.

34. The liquid crystal display device of claim 28, wherein said address shift register is intergated on said substrate simultaneous with the foremation of said first-mentioned transistors.

35. The liquid crystal display device of claim 31, wherein said data shift register is integrated on said substrate simultaneous with the formation of first-mentioned transistors.

36. An active matrix assembly for a liquid crystal display device including a plurality of liquid crystal display elements and associated drive circuit components in the matrix arranged in columns and rows, comprising:

a transparent substrate selected from the group consisting of glass, soda glass, high melting point glass and quartz;

a first thin film of silicon selectively deposited on said substrate for defining a source, channel and drain region of a metal-oxide-semiconductor transistor associated with each display element;

an insulation film deposited on said first film of silicon; and a second film of silicon selectively deposited on said first insulation film defining a gate of said transistor and one electrode of a storage capacitor associated with said transistor.

37. The active matrix assembly of claim 36, wherein said second silicon film defines the lower electrode of said storage capacitor.

38. The active matrix assembly of claim 36, wherein the first silicon film defines the lower electrode of the storage capacitor and the insulation film defines a dielectric film of said capacitor and said second silicon film defines the upper electrode of the capacitor and the driving electrode.

39. The active matrix assembly of claim 36, wherein each said silicon film has a thickness of about 3,700 Å, or less.

40. The active matrix assembly of claim 36, wherein said first silicon film is deposited as a non-doped layer.

41. The active matrix assembly of claim 40, wherein said source and drain regions are formed by doping impurities into said first silicon film utilizing the gate as a mask.

42. An active matrix assembly for a liquid crystal display device including a plurality of liquid crystal display elements and associated drive circuit components in the matrix arranged in columns and rows, comprising:
a transparent substrate selected from the group consisting of glass, soda glass, high melting point glass and quartz;
a first thin film of silicon selectively deposited on said substrate;
an insulation film deposited on said first film of silicon;
a second thin film of silicon selectively deposited on said first insulation film;
one of said first and second films of silicon defining one of a source, channel and drain region of a metal-oxide-semiconductor transistor and a gate of said transistor, said transistor coupled to an associated display element for driving said display element; and
a transparent conductive wiring material deposited for forming spaced data lines and an array of transparent driving electrodes, each of said driving electrodes coupled to an associated transistor.

43. The active matrix assembly of claim 42, wherein said transparent conductive wiring is selected from the group consisting of an indium and tin oxide transparent conductive film, a metal film having a thickness of about 500 Å or less, or a thin film of silicon.

44. The active matrix assembly of claim 42, wherein each said silicon film has a thickness of about 3,700 Å, or less.

45. An active matrix assembly for a liquid crystal display device including a plurality of liquid crystal display elements and associated drive circuit components in the matrix arranged in columns and rows, each of said display elements comprisng:
a transparent substrate selected from the group consisting of glass, soda glass, high-melting point glass or quartz;
a thin film of silicon selectively deposited on said substrate for defining a source, channel and drain region of a metal-oxide-semiconductor transistor;
a gate insulation film on said film of silicon;
a gate on said gate insulation film; and
a thin film of a transparent conductive material selectively deposited on said substrate for defining an associated liquid crystal driving electrode coupled to said transistor.

46. The active matrix assembly of claim 45, wherein the thin film of silicon is one of polycrystalline silicon or amorphous silicon.

47. The active matrix assembly of claim 45, wherein the transparent conductive material is one of an indium and tin oxide, tin oxide or aluminum.

48. An active matrix assembly for a liquid crystal display device including a plurality of liquid crystal display elements and associated drive circuit components in the matrix arranged in columns and rows, comprising:
a transparent substrate selected from the group consisting of glass, soda glass, high-melting point glass or quartz;
a thin film of silicon selectively deposited on said substrate for defining a source, channel and drain region of a metal-oxide-semiconductor transistor associated with each display element in the matrix;
a gate insulation film on said thin film of silicon;
a gate on said gate insulation film; and
a transparent conductive material film selectively deposited on said substrate for defining spaced gate lines and gates of said transistors and a matrix of associated liquid crystal driving electrodes, each driving electrode coupled to associated transistor.

49. The active matrix assembly of claim 48, wherein said picture element electrodes are formed of a thin film of indium and tin oxide, tin oxide and aliminum.

50. The active matrix assembly of claim 48, wherein the thin film silicon is one of polycrystalline silicon or amorphous silicon.

51. An active matrix assembly for a liquid crystal display device including a plurality of liquid crystal display elements and associated drive circuit components in the matrix arranged in columns and rows, comprising:
a transparent substrate selected from the group consisting of glass, soda glass, high-melting point glass or quartz;
a thin film of silicon selectively deposited on said substrate for defining a source, channel and drain region of a metal-oxide-semiconductor transistor associated with each display element in the matrix;
a gate insulation film on said thin film of silicon;
a gate on said gate insulation film; and
a transparent conductive film selectively deposited on said substrate for defining gates of said transistors and one electrode of a storage capacitor associated with each said transistor.

52. The active matrix assembly of claim 51, wherein said thin film of silicon is one of polycrystalline silicon or amorphous silicon.

53. The active matrix assembly of claim 51, wherein said transparent conductive film is one of indium and tin oxide, tin oxide or aluminum.

* * * * *